US012682288B2

(12) United States Patent
Bruce et al.

(10) Patent No.: US 12,682,288 B2
(45) Date of Patent: ***Jul. 14, 2026

(54) ENFORCING, WITH RESPECT TO CHANGES IN ONE OR MORE DISTINGUISHED INDEPENDENT VARIABLE VALUES, MONOTONICITY IN THE PREDICTIONS PRODUCED BY A STATISTICAL MODEL

(71) Applicant: MFTB Holdco, Inc., Seattle, WA (US)

(72) Inventors: Andrew Bruce, Seattle, WA (US); Chunyi Wang, Seattle, WA (US); Yeng Bun, Seattle, WA (US); Andrew Martin, Seattle, WA (US)

(73) Assignee: MFTB Holdco, Inc., Seattle, WA (US)

( * ) Notice: Subject to any disclaimer, the term of this patent is extended or adjusted under 35 U.S.C. 154(b) by 261 days.

This patent is subject to a terminal disclaimer.

(21) Appl. No.: 18/425,665

(22) Filed: Jan. 29, 2024

(65) Prior Publication Data

US 2026/0037853 A1 Feb. 5, 2026

Related U.S. Application Data

(63) Continuation of application No. 17/002,969, filed on Aug. 26, 2020, now Pat. No. 11,886,962, which is a
(Continued)

(51) Int. Cl.
*G06N 20/00* (2019.01)
*G06F 17/18* (2006.01)
(Continued)

(52) U.S. Cl.
CPC ............. *G06N 20/00* (2019.01); *G06F 17/18* (2013.01); *G06F 30/20* (2020.01); *G06N 5/04* (2013.01)

(58) Field of Classification Search
CPC ......... G06F 17/18; G06F 30/20; G06N 20/00; G06N 5/04
See application file for complete search history.

(56) References Cited

U.S. PATENT DOCUMENTS 8,140,421 B1 * 3/2012 Humphries ............ G06Q 50/16
705/40
8,676,680 B2 * 3/2014 Humphries ............ G06Q 30/02
705/38
(Continued)

FOREIGN PATENT DOCUMENTS

WO WO-2005106656 A2 * 11/2005 ........... G06Q 10/087

OTHER PUBLICATIONS

Manski, Charles F., and John V. Pepper. "Monotone Instrumental Variables: With an Application to the Returns to Schooling." Econometrica 68 (Jul. 2000): 997-1010. (Year: 2000).*
(Continued)

*Primary Examiner* — Randall K. Baldwin
(74) *Attorney, Agent, or Firm* — Merchant & Gould, P.C.

(57) ABSTRACT

A facility for estimating a value relating to a occurrence is described. The facility receives a first occurrence that specifies a plurality of independent variables including a distinguished independent variable designated to be monotonically linked to a dependent variable. The facility subjects the first independent variable values to a statistical model to obtain a first value of the dependent variable. The facility receives a second occurrence that specifies the plurality of independent variables, the distinguished independent variable varying from the first value in a first direction. The facility subjects the second independent variable values to the statistical model to obtain a second value of the depen-
(Continued)

dent variable, guaranteed not to vary from the first value of the dependent variable in a second direction opposite the first direction.

20 Claims, 5 Drawing Sheets

Related U.S. Application Data continuation of application No. 15/439,388, filed on Feb. 22, 2017, now Pat. No. 10,789,549.

(60) Provisional application No. 62/300,054, filed on Feb. 25, 2016.

(51) Int. Cl.
  *G06F 30/20* (2020.01)
  *G06N 5/04* (2023.01)

(56) References Cited

U.S. PATENT DOCUMENTS

| | | | | |
|---|---|---|---|---|
| 10,380,653 | B1* | 8/2019 | Flint | G06Q 30/0278 |
| 10,789,549 | B1* | 9/2020 | Bruce | G06N 20/00 |
| 10,984,489 | B1* | 4/2021 | Bruce | G06Q 30/0278 |
| 11,886,962 | B1* | 1/2024 | Bruce | G06F 17/18 |
| 2004/0024773 | A1* | 2/2004 | Stoffel | G06N 5/025 |
| | | | | 707/999.102 |
| 2005/0144147 | A1* | 6/2005 | Lee | G06N 20/00 |
| | | | | 706/12 |
| 2007/0185727 | A1* | 8/2007 | Ma | G06Q 30/0278 |
| | | | | 705/306 |
| 2009/0030864 | A1* | 1/2009 | Pednault | G06V 10/7625 |
| | | | | 706/45 |
| 2015/0006605 | A1* | 1/2015 | Chu | G06Q 10/06 |
| | | | | 708/446 |
| 2015/0066834 | A1* | 3/2015 | Jeffries | H03M 7/70 |
| | | | | 707/752 |
| 2015/0356576 | A1* | 12/2015 | Malaviya | G06Q 30/0202 |
| | | | | 705/7.31 |
| 2015/0379430 | A1* | 12/2015 | Dirac | G06N 20/00 |
| | | | | 706/12 |
| 2016/0246863 | A1* | 8/2016 | Sexton | G06F 16/904 |
| 2016/0267397 | A1* | 9/2016 | Carlsson | G06N 3/04 |
| 2020/0210610 | A1* | 7/2020 | Nerurkar | H04L 63/105 |
| 2023/0068246 | A1* | 3/2023 | Jeffries | G06F 16/284 |

OTHER PUBLICATIONS

Lu, J. F., and L. Lin HZ Wen. "An improved method of real estate evaluation based on Hedonic price model." IEEE International Engineering Management Conference. 2004. (Year: 2004).*

Zurowski, Brian."Essays in Social and Behavioral Economics." Retrieved from the University of Minnesota Digital Conservancy, http://hdl.handle.net/11299/175495 (Year: 2015).*

Oladunni, Timothy, and Sharad Sharma. "Predictive Real Estate Multiple Listing System Using MVC Architecture and Linear Regression." ISCA 24th International Conference on Software Engineering and Data Engineering. 2015. (Year: 2015).*

Oladunni, Timothy, and Sharad Sharma. "Hedonic Housing Theory—A Machine Learning Investigation." (Year: 2016).*

Tutz, Gerhard, and Moritz Berger. "Tree-structured modelling of categorical predictors in regression." arXiv preprint arXiv: 1504. 04700 (2015). (Year: 2015).*

Altendorf, Eric E., Angelo C. Restificar, and Thomas G. Dietterich. "Learning from sparse data by exploiting monotonicity constraints." arXiv preprint arXiv:1207.1364 (2012). (Year: 2012).*

Daniels, Hennie AM, and Marina V. Velikova. "Derivation of monotone decision models from noisy data." IEEE Transactions on Systems, Man, and Cybernetics, Part C (Applications and Reviews) 36.5 (2006): 705-710. (Year: 2006).*

* cited by examiner

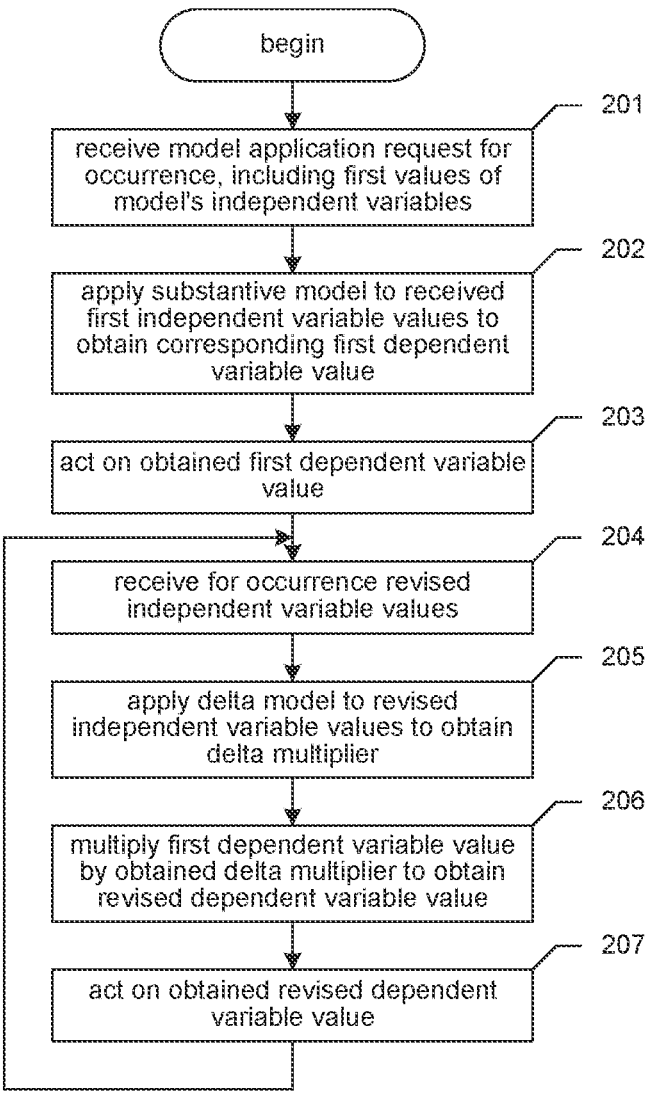

begin receive model application request for
occurrence, including first values of
model's independent variables — 201 apply substantive model to received
first independent variable values to
obtain corresponding first dependent
variable value — 202 act on obtained first dependent variable
value — 203 receive for occurrence revised
independent variable values — 204 apply delta model to revised
independent variable values to obtain
delta multiplier — 205 multiply first dependent variable value
by obtained delta multiplier to obtain
revised dependent variable value — 206 act on obtained revised dependent
variable value — 207

ENFORCING, WITH RESPECT TO CHANGES IN ONE OR MORE DISTINGUISHED INDEPENDENT VARIABLE VALUES, MONOTONICITY IN THE PREDICTIONS PRODUCED BY A STATISTICAL MODEL

CROSS-REFERENCE TO RELATED APPLICATION(S)

This application is a continuation of U.S. patent application Ser. No. 17/002,969 filed on Aug. 26, 2020 (now U.S. Pat. No. 11,886,962), which is continuation of U.S. patent application Ser. No. 15/439,388 filed on Feb. 22, 2017 (now U.S. Pat. No. 10,789,549), which claims the benefit of U.S. Provisional Application No. 62/300,054 filed on Feb. 25, 2016, all of which are incorporated herein by reference in their entireties.

TECHNICAL FIELD

This patent application is directed to the field of machine learning.

BACKGROUND

Statistical models are a machine learning mechanism for predicting for a system the value of a dependent variable based upon the values of related independent variables. Typically a model is trained to do so for a particular domain using "observations," each a combination of a set of independent variable values that occur in the system with a particular value of the dependent variable. Training the model based upon these observations involves defining the model in such a way that it predicts, for the set of independent variable values of each observation, a value of the dependent variable that is similar to the dependent variable value of the observation. Once trained, a model can be applied to a particular set of independent variable values to predict what dependent variable value will occur in the system for this set of independent variable values.

A variety of types of statistical models are used in this way, including linear regression models and random forest models. A linear regression model is a mathematical expression in which a constant coefficient is established for each independent variable, along with a single constant intercept value. These constant values defining the linear regression model are established in a way that fits the linear regression model to the training observations. To apply the trained linear regression model to a particular set of independent variable values, each independent variable value of the set is multiplied by the corresponding coefficient, and these products are summed, along with the intercept value.

A random forest model constitutes a collection of partitioning decision trees. These decision trees are typically binary trees, each of which can be traversed from its root to a leaf based upon a set of independent variable values for which a dependent variable value is to be predicted. In particular, each non-leaf node represents a partitioning of the range of possible values for an independent variable. Traversal to a leaf involves, at each non-leaf node beginning with root node, following the edge assigned the part of the range of possible values for the corresponding independent variable in which the value of the independent variable of the set of independent variable values falls. Each node of the tree is assigned a value constituting an aggregation—such as the mean—of the dependent variable values of the training observations whose independent variable values result in the traversal from the root to the node. Applying a random forest model to a set of independent variable values for which a dependent variable value is to be predicted constitutes traversing each tree of the forest from the root to a leaf based upon those independent variable values, then aggregating the values of the traversed-to leaf of each tree, such as by determining the mean of these values.

As part of training a random forest model, each tree of the random forest is typically constructed by randomly selecting a proper subset of the available observations. To create each node of the tree, beginning with root node, a partitioning of the possible range of values for a particular independent variable is determined that, among the observations represented by the node, divide these observations into two groups each of whose dependent variable values are the smallest total distance from the group's aggregated dependent variable value.

Often, after applying a trained model to predict a dependent variable value for a set of independent variable values, a user can vary one or more of the independent variable values of the set, and apply the model to the modified set of independent variable values to predict a new dependent variable value.

BRIEF DESCRIPTION OF THE DRAWINGS

FIG. 2 is a flow diagram showing a process performed by the facility in some embodiments to enforce monotonicity using the delta model approach.

DETAILED DESCRIPTION

Figure 1:
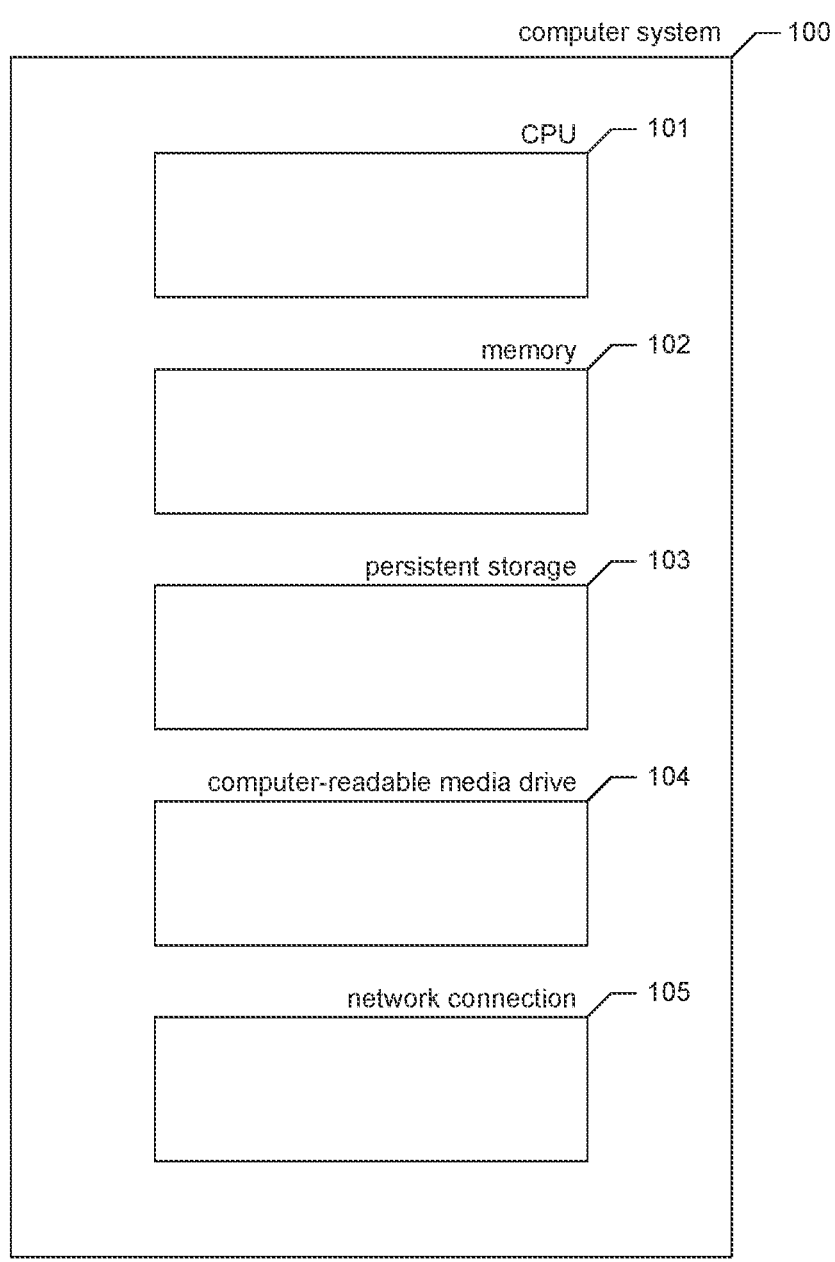
FIG. 1 is a block diagram showing some of the components typically incorporated in at least some of the computer systems and other devices on which the facility operates

The inventors have recognized significant disadvantages of conventional techniques that use statistical models to predict values of dependent variables. In particular, a user may (1) apply a trained model to predict the dependent variable value for a set of independent variable values, (2) alter one or more independent variable values in a way that the user expects to move the dependent variable value in a particular direction, (3) then apply the trained model to predict the dependent variable value for the changed independent variable values, and feel surprised that discovering that the dependent variable value has moved in the direction opposite the expected direction.

The inventors have noted that this result can have two different causes: (a) where the model is inaccurate over small changes in independent variable values, or (b) where the model is accurate in a way that is counterintuitive.

In response, the inventors have conceived and reduced to practice a software and/or hardware facility for enforcing, with respect to changes in one or more distinguished independent variable values, monotonicity in the predictions produced by a statistical model ("the facility"). In some cases, the set of independent variable values that changes is sometimes referred to herein as an "occurrence." One or more independent variable values of an occurrence may change, for example, because the initial values of these independent variables are discovered to be incorrect for the occurrence, or because a user wishes to determine the effect on dependent variable value of possible future changes to these independent variable values for the occurrence.

In some embodiments, the facility uses a delta model approach as follows: First, the facility applies a substantive model within which monotonicity is not enforced to predict the dependent variable value for a first set of independent variable values. When a prediction is subsequently sought based upon a modified version of the first set of independent variable values, rather than applying the substantive model to the modified set of values, the facility applies a delta model to the modified values to determine a delta multiplier, and returns a value of the dependent variable obtained by multiplying the earlier-predicted dependent variable value by the determined delta multiplier. In some embodiments, the facility establishes a pipeline of delta models that progresses from a complex delta model to a simple delta model, and uses the most complex delta model that succeeds for the modified set of values.

In some embodiments, the facility uses an innate monotonicity approach, in which it constructs a substantive model that internally enforces monotonicity with respect to the distinguished independent variables. For example, where the substantive model is a model that employs decision trees— such as a random forest model—as part of constructing these decision trees, when choosing for a node of the tree a range partition for a distinguished independent variable, the facility chooses only a range partitions that result in the predicted value of the dependent variable for the left child being less than the predicted value of the dependent variable for the right child. That is, among the observations being used to construct the tree, the observations that traverse the left edge from the node have a lower aggregate value than the observations that traverse the right edge from the node.

By operating in some or all of the ways described above, the facility can overcome localized forms of inaccuracy inherent in many conventional statistical models, and can provide a prediction result that is more likely to be regarded as accurate than a conventional statistical model.

FIG. 1 is a block diagram showing some of the components typically incorporated in at least some of the computer systems and other devices on which the facility operates. In various embodiments, these computer systems and other devices 100 can include server computer systems, desktop computer systems, laptop computer systems, netbooks, mobile phones, personal digital assistants, televisions, cameras, automobile computers, electronic media players, etc. In various embodiments, the computer systems and devices include zero or more of each of the following: a central processing unit ("CPU") 101 for executing computer programs; a computer memory 102 for storing programs and data while they are being used, including the facility and associated data, an operating system including a kernel, and device drivers; a persistent storage device 103, such as a hard drive or flash drive for persistently storing programs and data; a computer-readable media drive 104, such as a floppy, CD-ROM, or DVD drive, for reading programs and data stored on a computer-readable medium; and a network connection 105 for connecting the computer system to other computer systems to send and/or receive data, such as via the Internet or another network and its networking hardware, such as switches, routers, repeaters, electrical cables and optical fibers, light emitters and receivers, radio transmitters and receivers, and the like. While computer systems configured as described above are typically used to support the operation of the facility, those skilled in the art will appreciate that the facility may be implemented using devices of various types and configurations, and having various components.

FIG. 2 is a flow diagram showing a process performed by the facility in some embodiments to enforce monotonicity using the delta model approach. Examples of the performance of this method with respect to particular modeling domains are further discussed below. In act 201, the facility receives a request to apply the model to a particular occurrence to obtain for the occurrence a value of the model's dependent variable. The received request includes a first set of values of the model's independent variables. In act 202, the facility applies the substantive model to the first set of independent variable values received in act 201 in order to obtain a corresponding first value of the dependent variable. In act 203, the facility acts on the first value of the dependent variable obtained in act 202. In act 204, the facility receives for the same occurrence a set of independent variable values in which the value of at least one independent variable is changed with respect to the immediately preceding set of independent variable values received in act 201 or 204. In act 205, the facility applies a delta model to the revised independent variable values most recently received in act 204 to obtain a delta multiplier. In act 206, the facility multiplies the dependent variable value by the delta multiplier obtained in act 205 in order to obtain a revised dependent variable value. In act 207, the facility acts on the obtained revised dependent variable value. After act 207, the facility continues in act 204 to receive the next set of revised independent variable values for the occurrence.

Those skilled in the art will appreciate that the acts shown in FIG. 2 and in each of the flow diagrams discussed below may be altered in a variety of ways. For example, the order of the acts may be rearranged; some acts may be performed in parallel; shown acts may be omitted, or other acts may be included; a shown act may be divided into sub-acts, or multiple shown acts may be combined into a single act, etc.

Figure 3:
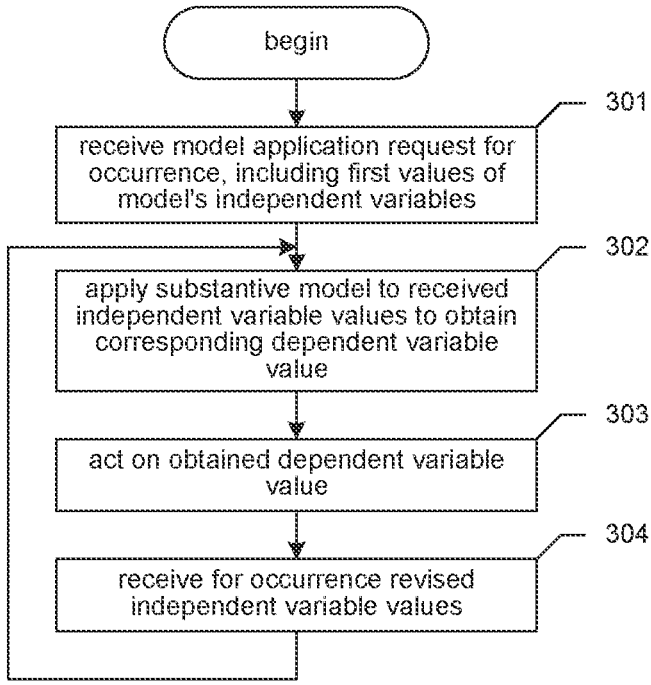
FIG. 3 is a flow diagram showing a process performed by the facility in some embodiments to enforce monotonicity using the innate monotonicity approach.

FIG. 3 is a flow diagram showing a process performed by the facility in some embodiments to enforce monotonicity using the innate monotonicity approach. In act 301, the facility receives a request to apply the model to a particular occurrence to obtain for the occurrence a value of the model's dependent variable. The received request includes a set of values of the model's independent variables. In act 302, the facility applies the substantive model to the set of independent variable values most recently received in act 301 in order to obtain a corresponding value of the dependent variable. The facility relies on aspects of the substantive model to enforce monotonicity of the dependent variable with respect to the distinguished independent variable or variables. In act 303, the facility acts on the value of the dependent variable most recently obtained in act 302. In act 304, the facility receives for the same occurrence a set of independent variable values in which the value of at least one independent variable is changed with respect to the immediately preceding set of independent variable values received in act 301 or 304. After act 304, the facility continues in act 302 to apply the substantive model to the revised independent variable values received in act 304.

Figure 4:
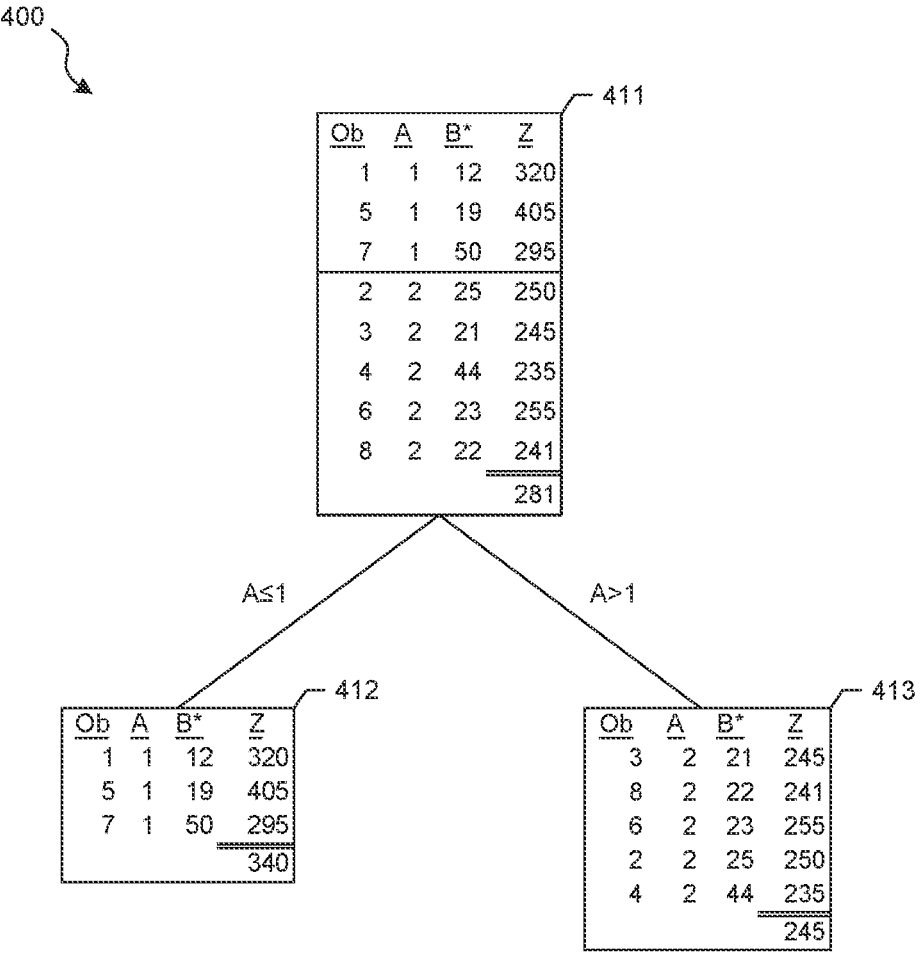
FIG. 4 is a data structure diagram showing a first point in the facility's construction, for the innate monotonicity approach, of a classification tree data structure that makes up part of a random forest model.

FIG. 4 is a data structure diagram showing a first point in the facility's construction, for the innate monotonicity approach, of a classification tree data structure that makes up part of a random forest model. At this point, the tree 400 is made up of a root note 411 having child nodes 412 and 413. The tree is constructed using eight training observations each specifying values of at least two independent variables, A and B*. The asterisk of independent variable B* indicates that it is a distinguished independent variable for which monotonicity is enforced by the facility. The observations also each specify a value of the dependent variable, Z. It can be seen that the root node 411 represents all 8 of these training observations. It can also be seen that the root node has a value of 281, obtained by aggregating the dependent variable values of all 8 of the training observations represented by the root note using the mean aggregation function.

Left child 412 is connected to root node 411 by an "A≤1" edge, while right child 413 is connected to root node 411 by an "A>1" edge. That is, the 8 observations represented by the root node are split into those in which the value of independent variable A is less than or equal to one, and those in which the value of independent variable A is greater than one. It can be seen that former three observations (observations 1, 5, and 7) are represented by left child 412, while the latter five observations (observations 2, 3, 4, 6, and 8) are represented by right child 413. Child node 412 has the value 340—the mean of the dependent variable values of the 3 observations that it represents, while child node 413 has the value 245—the mean of the dependent variable values of the 5 observations that node 413 represents.

One should note that, because the root node was split on values of an independent variable that is not distinguished and for which monotonicity is not enforced, the facility was permitted to establish a split—embodied by child nodes 412 and 413—in which the value of the left child (node 412), 340, is greater than the value of the right child (node 413), 245.

Figure 5:
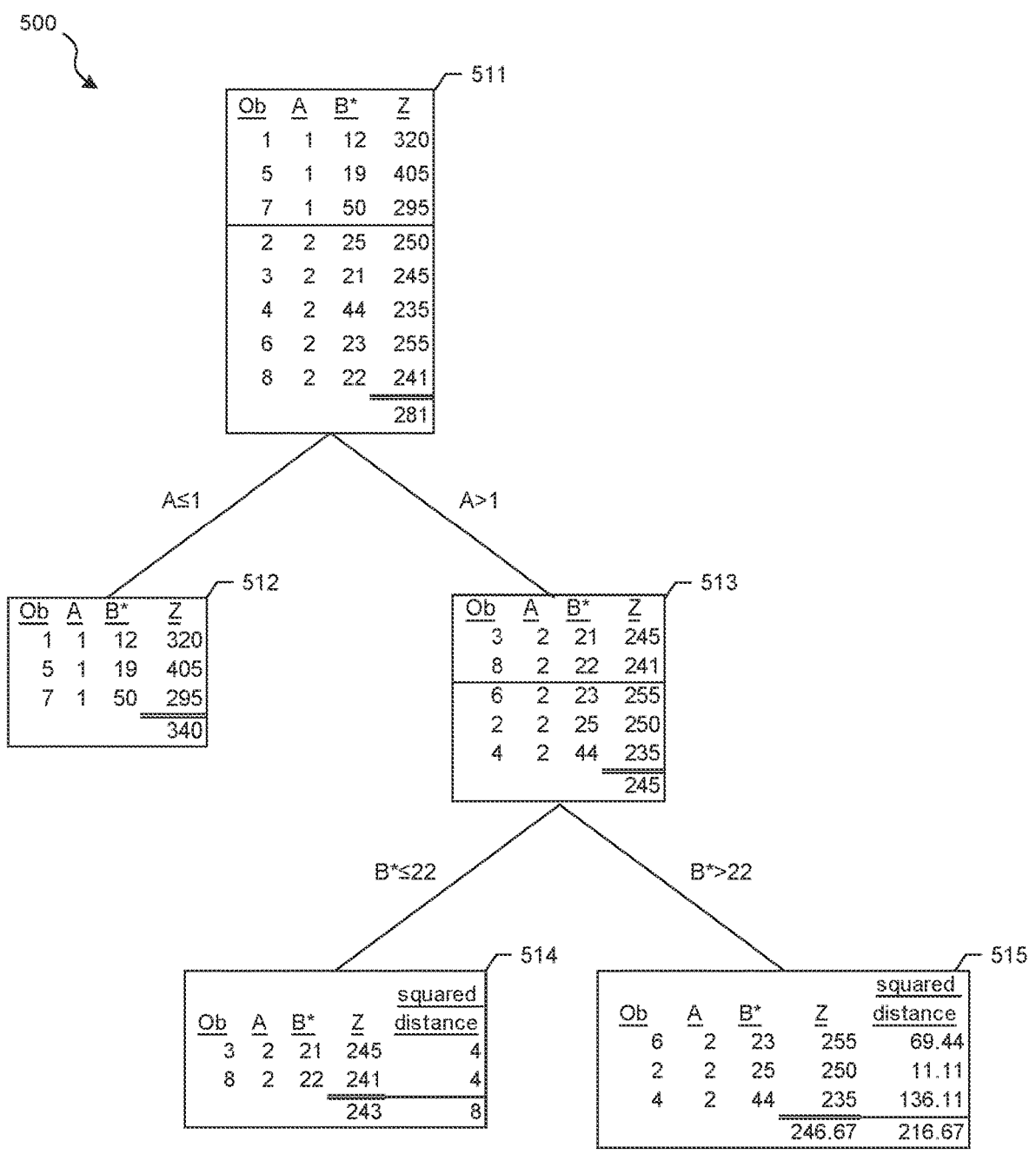
FIG. 5 is a data structure diagram showing a second point in the facility's construction, for the innate monotonicity approach, of a classification tree data shown in FIG. 4.

FIG. 5 is a data structure diagram showing a second point in the facility's construction, for the innate monotonicity approach, of a classification tree data shown in FIG. 4. In particular, FIG. 5 illustrates the facility's enforcement of monotonicity for a distinguished independent variable by declining to split on a distinguished independent variable at a point that creates a left child whose value is greater than that of its right sibling.

At this point, in addition to nodes 511-513 which appear in FIG. 4, the tree 500 also includes nodes 514 and 515, both children of node 513 and representing a split of node 513. Left child 514 is connected to its parent 513 by a "B*≤22" edge, while right child node 515 is connected to its parent 513 by a "B*>22" edge. By examining node 513, whose five represented observations are shown sorted in increasing order of their values of independent variable B*, it can be seen that there are four possible ways to split node 513 on independent variable B*, the second of which is shown in FIG. 5: (1) between the values 21 and 22 of that independent variable, (2) between the values 22 and 23, (3) between the values 23 and 25, and (4) between the values 25 and 44.

In the first possible split, the value of the left child, 245, would not be greater than the value of the right child, 245.5. In the second possible split, the value of the left child, 243, would similarly not be greater than the value of the right child, 246.67. In each of the third and fourth possible splits, however, the value of the left child would be greater than the right child: 247 vs. 242.5, and 247.75 vs. 235, respectively. For this reason, because B* is a distinguished independent variable, the facility is prevented from pursuing the third and fourth possible splits. Among the first and second possible splits, the facility selects the possible split that produces the smallest overall sum of squared distances between each child's value and the dependent variable values of the observations it represents. The second possible split produces an overall sum of squared distances of 220.67 (that is, $(245-243)^2+(241-243)^2+(255-246.67)^2+(250-246.67)^2+(235-246.67)^2$), which is smaller than the overall sum of squared distances produced by the first possible split, 240.75. Accordingly, the facility selects the second possible split, as shown in FIG. 5. This is despite the fact that both the third and fourth possible splits would produce lower overall sums of squared distances than the second possible split—212.5 and 103.19, respectively.

As a result of selecting the second possible split of node 513, the facility ensures that, if an occurrence to which the model containing tree 500 is being applied is for example adjusted from having a value of B* of 22 to a value of B* of 23, the value produced for the occurrence would increase, from 243 to 246.67, and would not decrease. Indeed, there are no increases in B* from one value of B* to any higher value of B* that cause the value produced by the tree for the occurrence to decrease.

The construction of a sample tree shown in FIGS. 4 and 5 relates to an example in which the facility enforces positive monotonicity of the value of the dependent variable with respect to values of the distinguished independent variable B*, in which the value of the dependent variable is prevented from moving in a different direction than the value of the distinguished independent variable. In some embodiments, the facility similarly enforces negative monotonicity of the value of the dependent variable with respect to values of a distinguished independent variable, in which the value of the dependent variable is prevented from moving in the same direction as the value of the distinguished independent variable (not shown). In some embodiments, the facility simultaneously enforces positive monotonicity for one independent variable, and negative monotonicity for another.

Modeling Domains

Those skilled in the art will appreciate that the facility is adaptable to a wide variety of modeling domains. An incomplete list follows.

estimating the merit of performing computing, storage, content delivery, etc. activities on each of a number of available cloud platforms;

Here, each available cloud platform is an occurrence. In various embodiments, a merit score for each occurrence is based upon predictions of one or more of cost, response time, level of reliability, level of security, error rate, etc. In some embodiments, the facility acts on estimation results, such as by causing particular activities to each be performed on the cloud platform for which the highest merit score is estimated.

estimating the merit of using each of a number of available wireless networks for communicating between a first device and one or more second devices; Here, each wireless network is a different occurrence. In various embodiments, a merit score for each occurrence is based upon predictions of one or more of cost, throughput level, latency level, level of reliability, level of security, error rate, etc. In some embodiments, the facility acts on estimation results, such as by causing a first device to communicate with one or more second devices using the network for which the highest merit score is estimated.

estimating a valuation of an asset, such as a home;

Here, each home is a different occurrence. In various embodiments, a variety of home attributes are considered as independent variables, including interior floor area ("square feet," or "Sqft"), lot size ("LotSize"), number of bathrooms ("#Bathrooms"), number of bedrooms ("#Bedrooms"), number of floors ("Stories"), type of home ("Usecode"), time since construction ("Age"), heating system type, cooling system type, roof type, architectural style, number of covered and uncovered parking spaces, etc. In some embodiments, the facility acts on estimation results, such as by displaying the estimated valuation for a home on a home detail page containing a variety of information about the home; including homes in a search result produced for a search for homes whose valuations fall into a particular range; determining a price at which to list a home for sale; determining a housing price index for a geographic area containing homes whose valuation is estimated; etc.

In some embodiments, in the home valuation modeling domain, the only distinguished independent variable for which the facility enforces same-direction monotonicity is interior floor area. In various embodiments, in the home valuation modeling domain, the facility enforces same-direction monotonicity for one or more distinguished independent variables among interior floor area, lot size, and number of bathrooms.

estimating the merit of following each of a number of different vehicular routes from a current location to a destination;

Here, each route is a different occurrence. In various embodiments, a merit score for each occurrence is based upon predictions of one or more of travel time; travel time certainty; costs such as energy costs, tolls, usage fees, etc.; mode of driving; availability of technological resources such as wireless communication resources, electrical charging facilities, resources that assist automatic or semiautomatic driving; availability of human amenities such as rest areas, restaurants, hotels, etc.; level of safety; level of driving difficulty; etc. In some embodiments, the facility acts on estimation results, such as by causing a vehicle to select the route for which the highest merit score is estimated.

Sample Delta Models

An illustrative example of delta models used by the facility in some embodiments in the home valuation modeling domain are described below.

In some embodiments, the facility uses a progression of delta models that have monotonic constraints on the coefficients for finished square feet (Sqft), lot size (LotSize), and bathroom count (#Bathrooms). Some of these delta models employ shape-constrained cubic basis splines (denoted as "ns" functions). These spline functions break up the input variable into pieces through which the facility fits a cubic polynomial that is constrained to have non-decreasing shape. The ends of each polynomial are also constrained so that they have the same value and are smooth at the transition point (i.e., the transition point has a second derivative of zero). These spline transformations are spline functions, as the spline breaks up the independent variable into sections (basis) based upon the local shape vs. the dependent variables. Thus, when the ns(x,y) function is used, price is the second argument, as that is implicitly the variable against which the interpolation is being evaluated.

In some embodiments, the facility fits unconstrained additional spline models, such as where spline expansion is used by the facility.

In a linear regression, the facility fits one slope for the entire range of an independent variable. With a spline, the facility selects a set of "knots" to break the data up into local ranges, each of which the facility fits with a local function. In the case of linear splines, the local function is a line segment; in the case of polynomial or natural splines, each local function is a smooth curve. The inventors regard natural splines as a good modeling choice because they produce smooth curves while limiting the squiggles that higher-order polynomial functions tend to produce.

The delta models outlined below include a set of smoothed features in which the facility takes the average value of the 50 nearest neighbors of a given property as the value of the independent variable; "SqftSmooth50" is the average value of the finished square feet of the fifty nearest geographic neighbors to a given property based upon latitude and longitude. Also, use code ("Usecode") is a categorical independent variable that tracks the structure type, e.g., townhome vs. condominium vs. detached single family vs. duplex.

In some embodiments, the facility creates nine delta models for each distinct geographic region modeled by the facility. The delta models are ordered from most complex (delta model #1) to least complex (delta model #9), with the complexity being decreased between delta models by removing variables, functions of variables, and interaction terms. The full delta model (#1) is a highly non-linear model and, in cases where transaction data is thin, sometimes fails to produce a viable model that can meet all the constraints placed on the spline functions. In those cases, the facility proceeds to the next most complex model to see if it meets constraints, and can continue up to the ninth model which is a fully linear model and is very likely to meet constraints.

In some embodiments, the facility tests each delta model's ability to satisfy constraints by checking the predictions these models make along a grid of possible values for the distinguished independent variables. For example, for a LotSize distinguished independent variable, the facility checks the predicted values along all lot sizes in a grid, such as from 0 to 5 acres. In some embodiments, the facility handles FinishedSquareFeet and bathroom count distinguished independent variables in a similar way. The facility also checks predictions along the surface of a 2-$d$ grid such as size vs square feet to make sure that all points along the surface formed by predictions in this grid are also monotonically increasing with the respective independent variables.

In some embodiments, the facility computes a "minimum response" table of allowable delta adjustments for the chosen model. This table maps percentage changes in the distinguished independent variables—such as for lot size—to an allowable range of delta adjustments. For example, where lot size increases by 10%, allowable delta adjustments are [1, 1.09]—that is, from no change in value to +9%. The facility generates the cutoffs in this table by looking at the predictions the selection model makes at given percentage changes and setting the lower bound at or near the $25^{th}$ and $75^{th}$ percentiles of delta values produced for a given change in a distinguished independent variable. This all works to limit extreme delta adjustments from being produced by the models.

In the descriptions of the nine delta models that follow, notation is employed as follows:

Parentheses denote functions of the data; e.g., log (#Bathrooms) means that the facility takes the logarithm of the data before entering it into the model for estimation.

Asterisks stand for interaction terms. So, in the case of height and weight: $\beta height*weight=\beta_1 height+\beta_2 weight+\beta_3 height \times weight$. In the preceding example, the facility estimates coefficients for all three terms, whereas a formula of height+weight alone has just a coefficient for each of height and weight separately and not for the term where they are multiplied (interacted).

Spline functions: ns(x,y) stands for constrained spline functions, whereas s(x,y) are unconstrained. Building age is a good example of a variable suited to an unconstrained spline function, as the value of a home often falls off from high new-construction values then rises later at ages corresponding to "classic" homes or homes with historical value.

1: Full model:

$$\Delta = \beta_0 + \beta_1 ns(\log(Sqft), \text{price}) +$$
$$\beta_2 ns(\log(Lotsize), \text{price}) + \beta_3 ZestPerSqftSmooth50 * \log(Sqft) +$$
$$\beta_3 SqftSmooth50 * \log(Sqft) + \beta_5 LotsizeSmooth50 * \log(LotSize) +$$
$$\beta_6 ns(\#Bathrooms, \text{price}) * \log(Sqft) + \beta_7 \log(\#Bedrooms) +$$
$$\beta_8 s(\log(Age), \text{price}) * \log(Sqft) + \beta_9 \#Stories + \beta_{10} Usecode$$

2: Like the full model but without the interaction term on #Bathrooms with square footage.

$$\Delta = \beta_0 + \beta_1 ns(\log(Sqft), \text{price}) +$$
$$\beta_2 ns(\log(Lotsize), \text{price}) + \beta_3 ZestPerSqftSmooth50 * \log(Sqft) +$$
$$\beta_3 SqftSmooth50 * \log(Sqft) + \beta_5 LotsizeSmooth50 * \log(LotSize) +$$
$$\beta_6 ns(\#Bathrooms, \text{price}) + \beta_7 \log(\#Bedrooms) +$$
$$\beta_8 s(\log(Age), \text{price}) * \log(Sqft) + \beta_9 \#Stories + \beta_{10} Usecode$$

3: Like the second model but drops the smoothed lot size interaction with lot size $$\Delta = \beta_0 + \beta_1 ns(\log(Sqft), \text{price}) + \beta_2 ns(\log(Lotsize), \text{price}) +$$
$$\beta_3 ZestPerSqftSmooth50 * \log(Sqft) + \beta_3 SqftSmooth50 * \log(Sqft) +$$
$$\beta_5 LotsizeSmooth50 + \beta_6 ns(\#Bathrooms, \text{price}) + \beta_7 \log(\#Bedrooms) +$$
$$\beta_8 s(\log(Age), \text{price}) * \log(Sqft) + \beta_9 \#Stories + \beta_{10} Usecode$$

4: Like the third model but removes the interaction between bathrooms and square feet:

$$\Delta = \beta_0 + \beta_1 ns(\log(Sqft), \text{price}) + \beta_2 ns(\log(Lotsize), \text{price}) +$$
$$\beta_3 zestPerSqftSmooth50 * \log(Sqft) + \beta_3 SqftSmooth50 * \log(Sqft) +$$
$$\beta_5 LotsizeSmooth50 + \beta_6 \#Bathrooms + \beta_7 \log(\#Bedrooms) +$$
$$\beta_8 s(\log(Age), \text{price}) * \log(Sqft) + \beta_9 \#Stories + \beta_{10} Usecode$$

5: Same as model four but drops Usecode from the model:

$$\Delta = \beta_0 + \beta_1 ns(\log(Sqft), \text{price}) +$$
$$\beta_2 ns(\log(Lotsize), \text{price}) + \beta_3 ZestPerSqftSmooth50 * \log(Sqft) +$$
$$\beta_3 SqftSmooth50 * \log(Sqft) + \beta_5 LotsizeSmooth50 + \beta_6 \#Bathrooms +$$
$$\beta_7 \log(\#Bedrooms) + \beta_8 s(\log(Age), \text{price}) * \log(Sqft) + \beta_9 \#Stories$$

6: Like model five but removes spline function on lot size:

$$\Delta = \beta_0 + \beta_1 ns(\log(Sqft), \text{price}) +$$
$$\beta_2 (\log(Lotsize) + \beta_3 ZestPerSqftSmooth50 * \log(Sqft) +$$
$$\beta_3 SqftSmooth50 * \log(Sqft) + \beta_5 LotsizeSmooth50 + \beta_6 \#Bathrooms +$$
$$\beta_7 \log(\#Bedrooms) + \beta_8 * s(\log(Age), \text{price}) * \log(Sqft) + \beta_9 \#Stories$$

7: Like model six but removes all interaction terms involving lot size:

$$\Delta = \beta_0 + \beta_1 sp(\log(Sqft), \text{price}) +$$
$$\beta_2 \log(Lotsize) + \beta_3 ZestPerSqftSmooth50 * \log(Sqft) +$$
$$\beta_3 SqftSmooth50 + \beta_5 LotsizeSmooth50 + \beta_6 \#Bathrooms +$$
$$\beta_7 \log(\#Bedrooms) + \beta_8 s(\log(Age), \text{price}) * \log(Sqft) + \beta_9 \#Stories$$

8: Like model seven but removes square feet interactions to create a no interactions model:

$$\Delta = \beta_0 + \beta_1 sp(\log(Sqft), \text{price}) + \beta_2 \log(Lotsize) +$$
$$\beta_3 ZestPerSqftSmooth50 + \beta_3 SqftSmooth50 + \beta_5 LotsizeSmooth50 +$$
$$\beta_6 \#Bathrooms + \beta_7 \log(\#Bedrooms) + \beta_8 s(\log(Age), \text{price}) + \beta_9 \#Stories$$

9: Like model eight but removes the spline function on square footage to make a model that is linear in all home characteristics but age.

$$\Delta = \beta_0 + \beta_1 \log(Sqft) + \beta_2 \log(Lotsize) + \beta_3 ZestPerSqftSmooth50 +$$
$$\beta_3 SqftSmooth50 + \beta_5 LotsizeSmooth50 + \beta_6 \#Bathrooms +$$
$$\beta_7 \log(\#Bedrooms) + \beta_8 s(\log(Age), \text{price}) + \beta_9 \#Stories$$

It will be appreciated by those skilled in the art that the above-described facility may be straightforwardly adapted or extended in various ways. While the foregoing description makes reference to particular embodiments, the scope of the invention is defined solely by the claims that follow and the elements recited therein.

We claim:

1. A method for enforcing monotonicity in a predictive model, comprising:

receiving a plurality of observations, each observation specifying values of each of a plurality of independent variables that include a distinguished independent variable designated to be monotonically linked to a dependent variable; and using the plurality of observations to construct a first machine learning model that—based on (1) a first set of values of the plurality of independent variables for which an estimated value of the dependent variable is to be provided, (2) a second set of values of the plurality of independent variables for which an estimated value of the dependent variable is to be provided, and (3) a value of the dependent variable estimated by a second machine learning model for the first set of values of the plurality of independent variables—estimates a multiplier by which the value of the dependent variable estimated by the second machine learning model for the first set of values of the plurality of independent variables is multiplied to obtain a value of the dependent variable for the second set of values of the plurality of independent variables, wherein a value of the distinguished independent variable in the first set of values varies from the value of the distinguished independent variable in the second set of values in a first direction, wherein a constraint specifies that the value of the dependent variable for the first set of values does not vary from the value of the dependent variable for the second set of values in a second direction that is opposite the first direction, wherein the first machine learning model comprises a plurality of sub-models in declining complexity, wherein a sub-model of the plurality of sub-models meets the constraint, wherein a complexity of the sub-model is (a) less than a complexity of a preceding sub-model that does not meet the constraint and (b) greater than a complexity of a following sub-model that does meet the constraint, wherein the sub-model is a function of one or more of the plurality of independent variables, and wherein the complexity of the sub-model is based on at least a number of the one or more of the plurality of independent variables, a number of constrained spline functions in the function, or a number of unconstrained spline functions in the function.

2. The method of claim 1, further comprising:

storing a data structure comprising information defining the second machine learning model, the second machine learning model configured to predict a value of the dependent variable for each of a plurality of independent variable value sets, such that, where the second machine learning model predicts a first value of the dependent variable for a first independent variable value set and predicts a second value of the dependent variable for a second independent variable value set in which the value of the distinguished independent variable varies from the value of the distinguished independent variable in the first independent variable value set in the first direction, the second value of the dependent variable does not vary from the first value of the dependent variable in the second direction.

3. The method of claim 1, further comprising:

subjecting independent variable values specified by a first observation of the plurality of observations to the first machine learning model to obtain a first value of the dependent variable; and subjecting the independent variable values specified by a second observation of the plurality of observations to the first machine learning model to obtain a second value of the dependent variable, wherein the value of the distinguished independent variable specified by the second observation varies from the value of the distinguished independent variable specified by the first observation in the first direction and wherein the second value of the dependent variable is guaranteed not to vary from the first value of the dependent variable in the second direction.

4. The method of claim 1, wherein the first machine learning model comprises:

a substantive sub-model that determines a first value of the dependent variable based on the first set of values of the plurality of independent variables; and a delta sub-model that determines a second value of the dependent variable based upon the first set of values and the second set of values of the plurality of independent variables and the first value of the dependent variable.

5. The method of claim 1, further comprising:

storing a data structure comprising information defining a delta model, the delta model configured to determine the multiplier.

6. The method of claim 1, wherein at least one sub-model of the plurality of sub-models employs a constrained spline function, and wherein at least another sub-model of the plurality of sub-models employs an unconstrained spline function.

7. The method of claim 1, wherein a first sub-model of the plurality of sub-models comprises a non-linear function of a majority of the plurality of independent variables.

8. The method of claim 7, wherein the non-linear function is a function of each of the plurality of independent variables.

9. The method of claim 7, wherein the first sub-model employs at least one constrained spline function and at least one unconstrained spline function, and wherein a last sub-model of the plurality of sub-models comprises a linear function of at least one of the plurality of independent variables.

10. The method of claim 1, wherein the plurality of sub-models comprises a plurality of delta models, and wherein at least one delta model produces an output satisfying a monotonicity constraint with respect to a distinguished independent variable.

11. The method of claim 10, wherein the plurality of delta models comprises a pipeline of delta models that progresses from a simple delta model to a complex delta model, and wherein satisfying the monotonicity constraint comprises using the complex delta model for a modified set of independent variable values.

12. An apparatus for enforcing monotonicity in a predictive model, comprising:

at least one processor configured to:

receive a plurality of observations, each observation specifying values of each of a plurality of independent variables that include a distinguished independent variable designated to be monotonically linked to a dependent variable; and use the plurality of observations to construct a first machine learning model that—based on (1) a first set of values of the plurality of independent variables for which an estimated value of the dependent variable is to be provided, (2) a second set of values of the plurality of independent variables for which an estimated value of the dependent variable is to be provided, and (3) a value of the dependent variable estimated by a second machine learning model for the first set of values of the plurality of independent variables—estimates a multiplier by which the value of the dependent variable estimated by the second machine learning model for the first set of values of the plurality of independent variables is multiplied to obtain a value of the dependent variable for the second set of values of the plurality of independent variables, wherein a value of the distinguished independent variable in the first set of values varies from the value of the distinguished independent variable in the second set of values in a first direction, wherein a constraint specifies that the value of the dependent variable for the first set of values does not vary from the value of the dependent variable for the second set of values in a second direction that is opposite the first direction, wherein the first machine learning model comprises a plurality of sub-models in declining complexity, wherein a sub-model of the plurality of sub-models meets the constraint, wherein a complexity of the sub-model is (a) less than a complexity of a preceding sub-model that does not meet the constraint and (b) greater than a complexity of a following sub-model that does meet the constraint, wherein the sub-model is a function of one or more of the plurality of independent variables, and wherein the complexity of the sub-model is based on at least a number of the one or more of the plurality of independent variables, a number of constrained spline functions in the function, or a number of unconstrained spline functions in the function.

13. The apparatus of claim 12, wherein the at least one processor is further configured to:

store a data structure comprising information defining the second machine learning model, the second machine learning model configured to predict a value of the dependent variable for each of a plurality of independent variable value sets, such that, where the second machine learning model predicts a first value of the dependent variable for a first independent variable value set and predicts a second value of the dependent variable for a second independent variable value set in which the value of the distinguished independent variable varies from the value of the distinguished independent variable in the first independent variable value set in the first direction, the second value of the dependent variable does not vary from the first value of the dependent variable in the second direction.

14. The apparatus of claim 12, wherein the at least one processor is further configured to:

subject independent variable values specified by a first observation of the plurality of observations to the first machine learning model to obtain a first value of the dependent variable; and subject the independent variable values specified by a second observation of the plurality of observations to the first machine learning model to obtain a second value of the dependent variable, wherein the value of the distinguished independent variable specified by the second observation varies from the value of the distinguished independent variable specified by the first observation in the first direction and wherein the second value of the dependent variable is guaranteed not to vary from the first value of the dependent variable in the second direction.

15. The apparatus of claim 12, wherein the first machine learning model comprises:

a substantive sub-model that determines a first value of the dependent variable based on the first set of values of the plurality of independent variables; and a delta sub-model that determines a second value of the dependent variable based upon the first set of values and the second set of values of the plurality of independent variables and the first value of the dependent variable.

16. The apparatus of claim 12, wherein the at least one processor is further configured to:

store a data structure comprising information defining a delta model, the delta model configured to determine the multiplier.

17. The apparatus of claim 12, wherein at least one sub-model of the plurality of sub-models employs a constrained spline function, and wherein at least another sub-model of the plurality of sub-models employs an unconstrained spline function.

18. The apparatus of claim 12, wherein a first sub-model of the plurality of sub-models comprises a non-linear function of a majority of the plurality of independent variables, and wherein the non-linear function is a function of each of the plurality of independent variables.

19. The apparatus of claim 18, wherein the first sub-model employs at least one constrained spline function and at least one unconstrained spline function, and wherein a last sub-model of the plurality of sub-models comprises a linear function of at least one of the plurality of independent variables.

20. The apparatus of claim 12, wherein at least one of the plurality of sub-models produces an output for one independent variable of the plurality of independent variables that is within a predetermined range.

* * * * *